United States Patent
Pauli et al.

(10) Patent No.: US 12,316,422 B2
(45) Date of Patent: May 27, 2025

(54) POINT TO MULTIPOINT TRANSMISSION USING A MULTI-ANTENNA SYSTEM

(71) Applicant: Nokia Technologies Oy, Espoo (FI)

(72) Inventors: Volker Pauli, Ansbach (DE); Fasil Berhanu Tesema, Munich (DE)

(73) Assignee: Nokia Technologies Oy, Espoo (FI)

( * ) Notice: Subject to any disclaimer, the term of this patent is extended or adjusted under 35 U.S.C. 154(b) by 34 days.

(21) Appl. No.: 18/020,365

(22) PCT Filed: Jul. 23, 2021

(86) PCT No.: PCT/EP2021/070756
§ 371 (c)(1),
(2) Date: Feb. 8, 2023

(87) PCT Pub. No.: WO2022/033845
PCT Pub. Date: Feb. 17, 2022

(65) Prior Publication Data
US 2023/0299837 A1   Sep. 21, 2023

(30) Foreign Application Priority Data

Aug. 12, 2020 (FI) .................................. 20205794

(51) Int. Cl.
| | | |
|---|---|---|
| H04L 23/02 | (2006.01) | |
| H03M 13/37 | (2006.01) | |
| H04B 7/0408 | (2017.01) | |
| H04B 7/06 | (2006.01) | |

(52) U.S. Cl.
CPC ...... *H04B 7/0695* (2013.01); *H03M 13/3761* (2013.01); *H04B 7/0408* (2013.01); *H04B 7/0617* (2013.01); *H04B 7/063* (2013.01); *H04B 7/0697* (2013.01)

(58) Field of Classification Search
CPC ...... H04B 7/0695; H04B 7/063; H04B 7/617; H04L 1/1812; H04L 1/1874; H04W 72/1273; H03M 13/3761; H03M 13/05
USPC ........................................ 375/262, 260, 267
See application file for complete search history.

(56) References Cited

U.S. PATENT DOCUMENTS

| | | | |
|---|---|---|---|
| 8,738,855 B2 * | 5/2014 | De Spiegeleer | .... G06F 11/1076 711/161 |
| 2016/0381596 A1 | 12/2016 | Hu et al. | |
| 2017/0105163 A1 * | 4/2017 | Hu | ........................ H04W 40/06 |

* cited by examiner

*Primary Examiner* — Khai Tran
(74) *Attorney, Agent, or Firm* — McCarter & English, LLP

(57) ABSTRACT

The present subject matter relates to an apparatus. The apparatus includes circuitry being configured for encoding sets of data elements into corresponding larger sets of encoding elements using a rateless erasure coding method, for each subset of one or more encoding elements of the sets of encoding elements determining a set of one or more beams of a multi-antenna system; and transmitting the subset of one or more encoding elements in the set of beams simultaneously.

17 Claims, 5 Drawing Sheets

POINT TO MULTIPOINT TRANSMISSION USING A MULTI-ANTENNA SYSTEM

CROSS REFERENCE TO RELATED APPLICATION

This patent application is a U.S. National Stage application of International Patent Application Number PCT/EP2021/070756 filed Jul. 23, 2021, which is hereby incorporated by reference in its entirety, and claims priority to FI 20205794 filed Aug. 12, 2020.

TECHNICAL FIELD

Various example embodiments relate to telecommunication systems, and more particularly to a point to multipoint transmission using a multi-antenna system.

BACKGROUND 5G refers to a new generation of radio systems and network architecture. 5G is expected to provide higher bitrates and coverage than the current long term evolution (LTE) systems. These systems are currently designed with a focus on point-to-point (PTP) transmissions, making use of large antenna arrays in combination with digital and/or analogue beamforming, to achieve very high spectral efficiency or at higher frequencies even to achieve bare coverage.

SUMMARY

Example embodiments provide an apparatus comprising means configured for: encoding (or coding) sets of data elements into corresponding larger sets of encoding elements using a rateless erasure coding method, for each subset of one or more encoding elements of the sets of encoding elements determining a set of one or more beams of a multi-antenna system, and transmitting the subset of one or more encoding elements in the set of beams. The transmission of the subset of one or more encoding elements in the different beams of the set of beams may, for example, be performed simultaneously.

According to further example embodiments, a method used in an apparatus such as a base station is provided. The method comprises encoding sets of data elements into corresponding larger sets of encoding elements using a rateless erasure coding method, for each subset of one or more encoding elements of the sets of encoding elements determining a set of one or more beams of a multi-antenna system, and transmitting the subset of one or more encoding elements in the set of beams simultaneously.

According to further example embodiments, a computer program is provided. The computer program comprises instructions for causing the base station for performing at least the following: encoding sets of data elements into corresponding larger sets of encoding elements using a rateless erasure coding method, for each subset of one or more encoding elements of the sets of encoding elements determining a set of one or more beams of a multi-antenna system, and transmitting the subset of one or more encoding elements in the set of beams simultaneously.

According to further example embodiments, an apparatus comprises means configured for: coding a code block to generate a coded block of coded bits for transmission to multiple receivers, determining multiple subsets of bits of the coded block representing different redundancy versions of the coded block respectively, for each subset of bits of the subsets of bits: determining a distinct set of one or more beams of a multi-antenna system and transmitting the subset of bits in the set of beams.

According to further example embodiments, a method used in an apparatus such as a base station is provided. The method comprises: coding a code block to generate a coded block of coded bits for transmission from a transmitter to multiple receivers, determining multiple subsets of bits of the coded block representing different redundancy versions of the coded block, for each subset of bits of the subsets of bits: determining a distinct set of one or more beams of a multi-antenna system and transmitting the subset of bits in the set of beams.

According to further example embodiments, a computer program is provided. The computer program comprises instructions for causing the base station for performing at least the following: coding a code block to generate a coded block of coded bits for transmission from a transmitter to multiple receivers, determining multiple subsets of bits of the coded block representing different redundancy versions of the coded block; for each subset of bits of the subsets of bits: determining a distinct set of one or more beams of a multi-antenna system and transmitting the subset of bits in the set of beams.

BRIEF DESCRIPTION OF THE DRAWINGS

The accompanying figures are included to provide a further understanding of examples, and are incorporated in and constitute part of this specification. In the figures.

DETAILED DESCRIPTION

Figure 1:
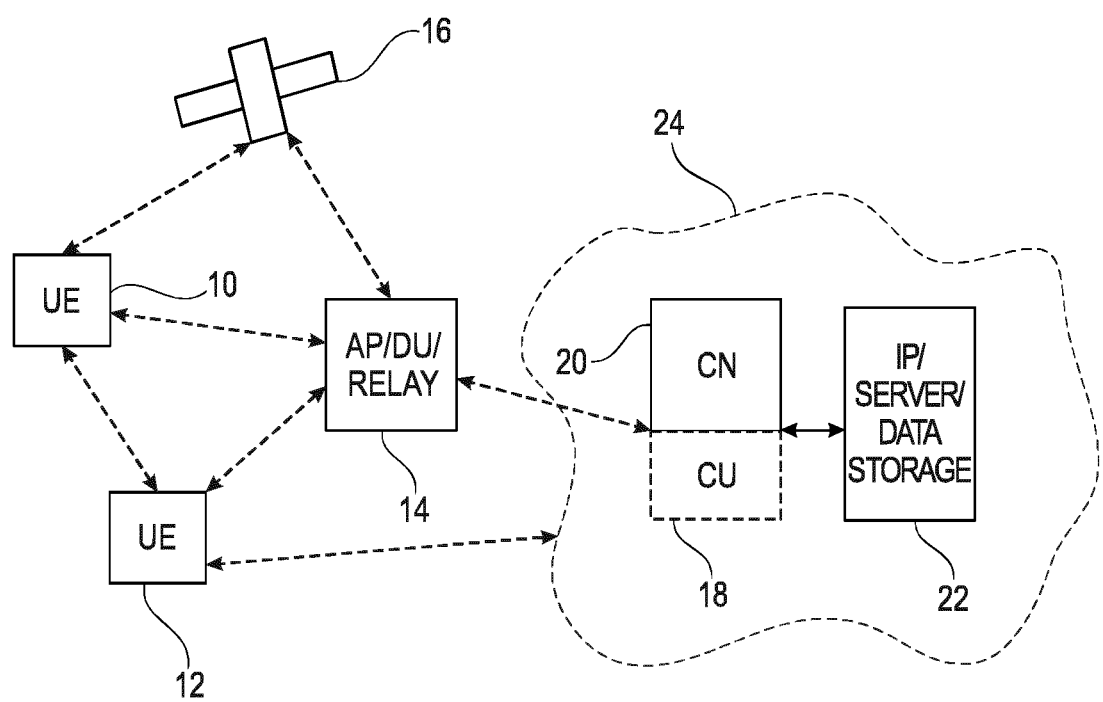
FIG. 1 illustrates a part of an exemplifying radio access network.

In the following description, for purposes of explanation and not limitation, specific details are set forth such as particular architectures, interfaces, techniques, etc., in order to provide a thorough understanding of the examples. However, it will be apparent to those skilled in the art that the disclosed subject matter may be practiced in other illustrative examples that depart from these specific details. In some instances, detailed descriptions of well-known devices and/or methods are omitted so as not to obscure the description with unnecessary detail.

The apparatus may be a multi-beam transmission system. The multi-beam transmission system may, for example, be a base station. The base station may serve user equipments located within the base station's geographical area of service or a cell. The multi-beam transmission system may be a part of a communication system. The communication system may support one or more radio access technologies (RATs). A radio access technology of the radio access technologies may, for example, be evolved universal terrestrial radio access (E-UTRA) or 5G new radio (NR), but it is not limited to, as a person skilled in the art may apply the present subject matter to other communication systems provided with necessary properties. The communication system may enable data communication between the multi-beam transmission system and the user equipments using a radio interface protocol. The radio interface protocol may comprise a user plane protocol, used for the transfer of user data (e.g. IP packets) between the multi-beam transmission system and the user equipment, and a control plane protocol that is used for control signaling between the multi-beam transmission system and the user equipment.

The multi-beam transmission system may or may not comprise the multi-antenna system. The multi-antenna system may comprise one or more arrays of antenna elements. The array may be a collection of multiple antenna elements arranged in a matrix of rows and columns or some other pattern. The multi-beam transmission system may, for example, be configured to perform a transmission method using the multi-antenna system in order to transmit data. The transmission method in accordance with the present subject matter may, for example, enable to transmit data in accordance with the radio interface protocol, wherein one or more functions of the radio interface protocol are adapted. The transmission method may, for example, comprise a point-to-multipoint (PTM) transmission method e.g. enabling a PTM service. The PTM transmission method may simultaneously transmit the same data through antenna elements of the multi-antenna system e.g. so as to increase system capacity. Additionally, the transmission method may, for example, comprise a point-to-point (PTP) transmission method. The present subject matter may enhance the transmission method by enabling a switch between the PTP transmission method, the combined PTP and PTM transmission and the PTM transmission method e.g. based on feedbacks from receiving devices or based on predefined switching rules. This may be particularly advantageous as the PTM transmission method may be performed using the same hardware as the PTP transmission method.

The transmission method may further be enhanced in accordance with the present subject matter by combining the transmission method with a beamforming technique. For that, the multi-antenna system may be used to perform the beamforming. The beamforming may be part of the transmission method. The beamforming may be a signal processing technique that may be used at the multi-beam transmission system to add together radiation patterns of each of the antenna elements in an array in such a way that they concentrate the energy into a narrow beam or lobe. Beamforming may be achieved by combining the signals communicated via antenna elements of an antenna array such that some of the signals experience constructive interference while others experience destructive interference. To create the desired constructive/destructive interference, the multi-beam transmission system may apply amplitude and/or phase offsets to signals transmitted from each of the antenna elements of the antenna array. The multi-beam antenna system may thus be configured using the beamforming technique to generate a set of one or more beams for each message to be transmitted simultaneously in the set of beams. The set of beams may be concurrent but independent directive beams. The set of beams may be provided with a high angular selectivity that may allow for significant frequency reuse and increase of a system capacity. The properties of the set of beams such as their numbers and directions may be determined based on the transmission method e.g. the properties of the set of beams for the PTP transmission method may be different from the PTM transmission method. The multi-antenna system may be implemented in different ways so that it may enable different beamforming technologies. For example, the multi-beam antenna system may be configured in accordance with an analog beamforming, a digital beamforming or a hybrid beamforming which is a combination of the analog beamforming and the digital beamforming. The set of beams determined for one subset of the encoding elements may or may not be the same set of beams determined for another subset of the encoding elements. For example, different sets of beams may be determined for different groups of the subsets (e.g. groups of consecutive subsets) of the encoding elements respectively e.g. one group may be transmitted with the set of beams of the PTM transmission and another group may be transmitted with the set of beams of the combined PTP and PTM transmission.

The multi-beam transmission system may, for example, be configured to receive or create a stream of data. The stream of data may be a stream of data packets. The stream of data may be transmitted using the transmission method. The stream of data may, for example, comprise user information. The transmission method may further be enhanced, in accordance with the present subject matter, by processing the data to be transmitted by introducing additional redundancy for error protection and thus for controlling errors in data transmission. For that, the data may be processed using a data processing method e.g. the data processing method may adapt a function of the radio interface protocol. The transmission method may comprise the data processing method. The data processing method may, for example, process the stream of data in order to enable to generate a stream of messages (each message comprises a set of one or more symbols) that may be transmitted through the multi-antenna system. The message may be a data unit that contains bits. Each bit of the bits may have a binary value (e.g., 1 or 0). For that, the data processing method may transform a set of K data elements of the stream of data into a larger set of N encoding elements. The set of K data elements may, for example, be consecutive data elements. For example, each consecutive set of K data elements of the stream of data may be transformed into a corresponding set of N encoding elements. The messages to be transmitted may comprise the encoding elements. The transformation may, for example, be performed using a rateless erasure coding method. The rateless erasure coding method may, for example, comprise a fountain coding method. The stream of messages may be transmitted in accordance with the transmission method via the sets of beams. For example, each message of the stream of messages may be transmitted via each beam of a respective set of beams. Accordingly, a receiving device of the messages may perform the corresponding rateless erasure decoding from a set of encoding elements of received messages. The receiving device may, for example, be a user equipment. The rateless erasure coding method may have a code rate defined as the ratio of the number K of data elements and N, the number of encoding elements. The code rate may be fixed (e.g. a different encoding element may be transmitted in every beam of the set of beams and e.g. 20% additional encoding elements may be provided to have successful decoding even in the presence of packet losses on a receiving device's strongest beam due to fast fading). In another example, the code rate may be adapted based on a feedback from the receiving device on reception rates experienced with respect to the encoding elements.

The present subject matter may enable a flexible implementation in that it may be performed on packet level and at different layers above a physical layer of the radio interface protocol. Thus, a data element as used herein may be a data unit of a protocol layer. A data unit may, for example, be a service data unit. According to one example, the set of K data elements may be a set of K data units. That is, the transformation may be performed at the data packet level because the data units are built from packets e.g. IP packets. In this case, the data processing method may be referred to as a packet-based data processing method. The set of K data units may, for example, be a set of service data units (SDUs) of a certain layer of the radio interface protocol. The certain layer may be a layer situated above a physical layer in the radio interface protocol. The certain layer, may, for example be a radio link control (RLC) layer. This may enable to minimize packet losses or counter measures against packet losses during intra-CU handover in the typical 5G CU/DU architecture. In another example, the certain layer may be a packet data convergence protocol (PDCP) layer. In one example, the packet-based data processing method may require that a predefined maximum number u of encoding elements be part of a transport block. The transport block may be defined as the data delivered by the MAC layer to the physical layer and vice versa. Transport blocks may be delivered once every Transmission Time Interval (TTI). The maximum number u of encoding elements per transport block may be smaller than the number N of the set of encoding elements e.g. u=1. It may be beneficial to only have a number of encoding elements per transport block as small as possible, because the likelihood of errors on different encoding elements in the same transport block may be highly correlated across different encoding elements. For example, the packet-based data processing method may comprise a number of parallel rateless erasure coding processes that contribute approximately one encoding element per transport block.

According to an example, the transmission method may comprise the packet-based data processing method and/or a bit-based data processing method. For example, the packet-based data processing method may provide transport blocks, as described above, to the bit-based processing method. The bit-based processing method may process the transport blocks in order to be transmitted in accordance with multiple redundancy versions.

According to an example, the bit-based processing method comprises for each code block of each transport block of a stream of transport blocks: coding the code block to generate a coded block of coded bits for transmission to multiple receivers, determining multiple subsets of bits of the coded block, wherein the multiple subsets represent different redundancy versions of the coded block respectively, and for each subset of bits of the subsets of bits: determining a distinct set of one or more beams of a multi-antenna system and transmitting the subset of bits in the set of beams. For example, the physical layer may receive a stream of transport blocks. Each transport block that is received at the physical layer may comprise or be split into Nc code blocks e.g. depending on its size, where Nc≥1. The transport block may be the chunk of data transmitted at once (e.g. in one TTI or slot). The transport block may be transmitted in one beam. Each transport block of the transport blocks may, for example, be processed according to the bit-based data processing method as follows: a channel coding such as Turbo coding or LDPC coding may be applied on each code block of the transport block. The channel coding of each code block of the transport block may result in one or more streams of bits depending on the channel coding technique. Moreover, a rate matching may be applied on the streams of bits. Depending on the channel coding being used, the rate matching may include different stages the aim of which is to provide a set of bits to be transmitted within a given TTI. For example, in case of the turbo coding, the rate matching may comprise three stages, namely sub-block interleaving, bit collection and bit selection. In case of the LDPC coding, the rate matching may include a bit selection and bit interleaving. Regardless of the channel coding being used, the rate matching may have as input a set of bits (named SET) e.g. written into a circular buffer. The bit-based data processing method may control transmission of data resulting from the rate matching in accordance with the present subject matter. For example, the rate matching may provide $N_{rv}$ subsets ($N_{rv} \geq 2$) of bits from the set of bits SET to the extent that each subset may fit into the assigned physical resource. The number of bits in each subset of the $N_{rv}$ subsets may represent the code block. That is, the decoding of a single subset may enable to reconstruct the respective code block. Each subset of the $N_{rv}$ subsets provides a redundancy version of the respective code block. At least part of the $N_{rv}$ subsets of bits may, for example, be overlapping. Thus, the rate matching may result in Nc subsets that represent the content of the transport block and one redundancy version. The Nc subsets may, for example, be encapsulated in a message. The redundancy versions may allow for the retransmission of the message. Thus, the Nc subsets may be transmitted together in a common message, e.g. in each slot where a message corresponding to one transport block is transmitted some subset of bits (a redundancy version) of each of the Nc code blocks is transmitted. The processing of the stream of the transport blocks may thus result in a stream of messages of a given redundancy version associated with the stream of received transport blocks respectively. The messages may further be processed e.g. to undergo scrambling, modulation, layer mapping, precoding, and resource element mapping. This may result in a stream of messages, wherein each message is associated with a respective transport block and comprises a set of one or more symbols. Each message which is associated with the transport block may be transmitted using the PTM transmission method and/or the PTP transmission method. For example, for each transport block, multiple messages of different redundancy versions may be provided. Each message of the multiple messages of different redundancy versions may be (re)transmitted in a respective distinct set of one or more beams e.g. the message of the first redundancy version may be transmitted in a first set of one or more beams, a subsequent second message of the second redundancy version may be transmitted in a second set of one or more beams and so on. The first and second sets of beams may have different directions and may be generated in accordance with beam sweeping.

The present transmission method may operate in relatively low protocol layers like physical and MAC layers. This is in contrast to another method where decisions are made at higher layers and hence may not permit the same agility of the adaptations.

The transmission method may further be improved by performing a dynamic beam management. This may enable to implement efficient PTM in wireless communication systems with large base station antenna arrays. For example, the transmission method may comprise a dynamic beam management method. Based on either measurement made in the downlink in combination with report information from the receiving device to the multi-beam transmission system or based directly on measurements made in the uplink, the dynamic beam management method may determine in which directions and/or in which beam(s) a message may be emitted. For example, the multi-beam transmission system may transmit some data via beams (PTP beams) using the PTP transmission method to a set of user equipments. The report information may, for example, comprise measurements on said PTP beams performed by the set of user equipments. Using the report information, the multi-beam transmission system may use (e.g. switch to) the PTM transmission method in order to transmit the stream of data using one or more sets of one or more beams that are derived from the measurements/reports from different UEs (of the set of UEs) interested in the PTM service. In another example, using the report information, the multi-beam transmission system may use (e.g. switch to) the PTM transmission method in order to transmit the stream of data to a subset of UEs of the set of UEs using a set of beams that is derived from the measurements/reports and to use the PTP transmission method in order to transmit the same stream of data to another subsets of UEs of the set of UEs.

In one example, the report information may be received from a set of user equipments. The report information is indicative of distinct beam directions B1, B2 . . . BJ, wherein each distinct beam direction may be received from one or more user equipments. Beam directions B1, B2 . . . BM (M≤J) may be selected from the distinct beam directions based on the number of user equipments that reported the beam directions. For example, a beam direction may be selected if the number of user equipments that reported said beam direction is higher than a threshold. Each beam of the determined set of beams in accordance with the present subject matter may have a beam direction of the selected beam directions respectively. This is in case the number M of selected beam directions can be handled by the multi-antenna system. However, in case the multi-antenna system may not generate the M beams at once, a subset of the selected M beam directions may be used to determine the set of beams, and remaining subset(s) of the selected beam directions may be covered by performing beam sweeping, i.e. served in subsequent transmission intervals. In one example, the non-selected J-M beam directions may be served according to the PTP transmission method.

In one example, the radio interface protocol may be configured or adapted in order to enable data communication in accordance with the transmission method as described herein. This may enable to automatically perform the transmission method at different base stations of the communication system. Each protocol of the user plane protocol and control protocol may comprise a respective set of layers. The set of layers may comprise a physical layer and one or more upper layers. The function of rateless erasure coding method may be implemented with a functional block inside any layer of the second and third layers of the radio interface protocol and the determination of the set(s) of beams in accordance with the present subject matter may be implemented in the physical layer.

For example, a stream of transport blocks may be generated and provided to the physical layer. The transport block may comprise one or more encoding elements. Each transport block of the stream of transport blocks may further be processed in the physical layer in order to be transmitted. For example, a coding procedure may be performed on each transport block which may result in a message per transport block. The coding procedure may, for example, comprise a channel coding and rate matching. The stream of messages may, for example, undergo scrambling, modulation, layer mapping, precoding, and resource element mapping. This may result in a stream of messages, wherein each message comprises a set of one or more symbols. Each message which is associated with a transport block may be transmitted using the PTM transmission method and/or the PTP transmission method. The set of beams may be determined accordingly. Each beam of the set of beams may be generated by a respective antenna array of the multi-antenna system. The same message of the stream of messages may be transmitted on each beam of the set of beams. The set of beams may be transmitted simultaneously. The set of beams may have a set of directions. For example, the set of beams determined for the PTM transmission, the set of beams determined for the PTP transmission, and the set of beams determined for both the PTM and PTP transmissions may each have a respective different set of directions. For example, the set of directions of the set of beams defined for the PTM transmission may be different from the set of directions of the set of beams defined for the PTP transmission and may be different from the set of directions of the set of beams defined for the combined PTP and PTM transmission. This may, for example, enable to switch between different transmission methods e.g. using beam sweeping. For example, each message of a first set of one or messages may be transmitted in each beam of a set of beams of the PTM transmission simultaneously, each message of a subsequent set of one or messages may be transmitted in each beam of a set of beams of the PTP transmission simultaneously and/or each message of a subsequent third set of one or messages may be transmitted in each beam of a set of beams of the PTP and PTM transmission simultaneously.

The transmission in the set of beams may be performed in accordance with a beam sweeping e.g. as part of the beamforming technique. The beam sweeping may change the set of directions of the set of beams into another set of directions e.g. to switch between the PTM transmission and the combined PTM and PTP transmission or to switch between different sets of directions of the same transmission method e.g. the PTM transmission. The beam sweeping may, for example, be performed before transmitting each message of the stream of messages e.g. each message may comprise a respective distinct subset of the encoding elements of the sets of encoding elements. That is, each message may be transmitted in a respective distinct set of beams. In another example, the beam sweeping may be performed on a periodic basis. For example, each message of a first sequence of messages may be transmitted in a first set of beams simultaneously, then each message of a subsequent second sequence of messages may be transmitted in a second set of beams simultaneously and so on, wherein the first and second sets of beams are different e.g. have different directions but need not necessarily be disjoint. In another example, the beam sweeping may be performed according to a set of beam-sweeping configurations. The set of beam-sweeping configurations may be predefined or dynamically be determined. Each beam-sweeping configuration defines distinct properties of the set of beams. Each beam-sweeping configuration may enable to determine one set of beams. Assuming for example that the set of beam-sweeping configurations comprises r configurations ordered from 1 to r. In this case, the transmission of each message of a first sequence of r messages may be performed using a distinct set of beams determined according to a respective beam-sweeping configuration following the order e.g. the first message of the first sequence is transmitted with the beam-sweeping configuration number 1, the second message of the first sequence is transmitted with the beam-sweeping configuration number 2, and so on. Then, each message of a subsequent second sequence of r messages may be performed using a distinct set of beams determined according to a respective beam-sweeping configuration following the order e.g. the first message of the second sequence is transmitted with the beam-sweeping configuration number 1, the second message of the second sequence is transmitted with the beam-sweeping configuration number 2, and so on. In one example, the beam-sweeping configurations may dynamically be defined based on report information from user equipments. E.g. as described with the dynamic beam management method, the received distinct beam directions B1, B2 . . . BJ may be used to define the different beam-sweeping configurations so that each beam-sweeping configuration is associated with a respective distinct set of beam directions of the beam directions B1, B2 . . . BJ.

According to an example, the transmission method may comprise the beamforming technique, the dynamic beam management method, the packet-based data processing method and/or the bit-based data processing method.

A receiving device such as a user equipment may be provided in accordance with the present subject matter, wherein the receiving device is configured to decode the set of encoding elements using a rateless erasure decoding method that corresponds to the rateless erasure coding method used to obtain the encoding elements.

According to an example, a base station is provided. The base station comprises means being configured for: encoding sets of data elements into corresponding larger sets of encoding elements using a rateless erasure coding method, for each subset of one or more encoding elements of the sets of encoding elements determining a set of one or more beams of a multi-antenna system, and transmitting the subset of one or more encoding elements in the set of beams simultaneously. The subsets of encoding elements are distinct consecutive subsets of encoding elements of the sets of encoding elements. For example, the sets of encoding elements may be processed as a stream of encoding elements.

FIG. 1 depicts examples of simplified system architectures only showing some elements and functional entities, all being logical units, whose implementation may differ from what is shown. The connections shown in FIG. 1 are logical connections; the actual physical connections may be different. It is apparent to a person skilled in the art that the system typically comprises also other functions and structures than those shown in FIG. 1.

The embodiments are not, however, restricted to the system given as an example but a person skilled in the art may apply the solution to other communication systems provided with necessary properties.

The example of FIG. 1 shows a part of an exemplifying radio access network. FIG. 1 shows devices 10 and 12. The devices 10 and 12 may, for example, be user devices. The devices 10 and 12 are configured to be in a wireless connection on one or more communication channels with a node 14. The node 14 is further connected to a core network 20. In one example, the node 14 may be an access node (such as (e/g)NodeB) 14 providing or serving devices in a cell. In one example, the node 14 may be a non-3GPP access node. The physical link from a device to a (e/g)NodeB is called uplink or reverse link and the physical link from the (e/g)NodeB to the device is called downlink or forward link. It should be appreciated that (e/g)NodeBs or their functionalities may be implemented by using any node, host, server or access point etc. entity suitable for such a usage.

A communications system typically comprises more than one (e/g)NodeB in which case the (e/g)NodeBs may also be configured to communicate with one another over links, wired or wireless, designed for the purpose. These links may be used for signaling purposes. The (e/g)NodeB is a computing device configured to control the radio resources of communication system it is coupled to. The NodeB may also be referred to as a base station, an access point or any other type of interfacing device including a relay station capable of operating in a wireless environment. The (e/g)NodeB includes or is coupled to transceivers. From the transceivers of the (e/g)NodeB, a connection is provided to an antenna unit that establishes bi-directional radio links to devices. The antenna unit may comprise a plurality of antennas or antenna elements. The (e/g)NodeB is further connected to the core network 20 (CN or next generation core NGC). For example, the (e/g)NodeB may connect to an access and mobility management function (AMF) and user plane function (UPF) in the control plane and user plane, respectively. Depending on the system, the counterpart on the CN side can be a serving gateway (S-GW, routing and forwarding user data packets), packet data network gateway (P-GW), for providing connectivity of devices (UEs) to external packet data networks, or mobile management entity (MME), etc.

The device (also called user device, UE, user equipment, user terminal, terminal device, etc.) illustrates one type of an apparatus to which resources on the air interface are allocated and assigned, and thus any feature described herein with a device may be implemented with a corresponding apparatus, such as a relay node. An example of such a relay node is a layer 3 relay (self-backhauling relay) towards the base station.

The device typically refers to a device (e.g. a portable or non-portable computing device) that includes wireless mobile communication devices operating with or without a subscriber identification module (SIM), including, but not limited to, the following types of devices: a mobile station (mobile phone), smartphone, personal digital assistant (PDA), handset, device using a wireless modem (alarm or measurement device, etc.), laptop and/or touch screen computer, tablet, game console, notebook, and multimedia device. It should be appreciated that a device may also be a nearly exclusive uplink only device, of which an example is a camera or video camera loading images or video clips to a network. A device may also be a device having capability to operate in Internet of Things (IoT) network which is a scenario in which objects are provided with the ability to transfer data over a network without requiring human-to-human or human-to-computer interaction, e.g. to be used in smart power grids and connected vehicles. The device may also utilize cloud. In some applications, a device may comprise a user portable device with radio parts (such as a watch, earphones or eyeglasses) and the computation is carried out in the cloud. The device (or in some embodiments a layer 3 relay node) is configured to perform one or more of user equipment functionalities. The device may also be called a subscriber unit, mobile station, remote terminal, access terminal, user terminal or user equipment (UE) just to mention but a few names or apparatuses.

Various techniques described herein may also be applied to a cyber-physical system (CPS) (a system of collaborating computational elements controlling physical entities). CPS may enable the implementation and exploitation of massive amounts of interconnected ICT devices (sensors, actuators, processors microcontrollers, etc.) embedded in physical objects at different locations. Mobile cyber physical systems, in which the physical system in question has inherent mobility, are a subcategory of cyber-physical systems. Examples of mobile physical systems include mobile robotics and electronics transported by humans or animals.

Additionally, although the apparatuses have been depicted as single entities, different units, processors and/or memory units (not all shown in FIG. 1) may be implemented. 5G enables using multiple input-multiple output (MIMO) antennas, many more base stations or nodes than an existing LTE system (a so-called small cell concept), including macro sites operating in co-operation with smaller stations and employing a variety of radio technologies depending on service needs, use cases and/or spectrum available. 5G mobile communications supports a wide range of use cases and related applications including video streaming, augmented reality, different ways of data sharing and various forms of machine type applications (such as (massive) machine-type communications (mMTC), including vehicular safety, different sensors and real-time control. 5G is expected to have multiple radio interfaces, namely below 6 GHz, cmWave and mmWave, and also being integrable with existing legacy radio access technologies, such as the LTE. Integration with the LTE may be implemented, at least in the early phase, as a system, where macro coverage is provided by the LTE and 5G radio interface access comes from small cells by aggregation to the LTE. In other words, 5G is planned to support both inter-RAT operability (such as LTE-5G) and inter-RI operability (inter-radio interface operability, such as below 6 GHz-cmWave, below 6 GHz-cmWave-mmWave). One of the concepts considered to be used in 5G networks is network slicing in which multiple independent and dedicated virtual sub-networks (network instances) may be created within the same infrastructure to run services that have different requirements on latency, reliability, throughput and mobility.

The current architecture in LTE networks is fully distributed in the radio and fully centralized in the core network. The low latency applications and services in 5G require to bring the content close to the radio which leads to local break out and multi-access edge computing (MEC). 5G enables analytics and knowledge generation to occur at the source of the data. This approach requires leveraging resources that may not be continuously connected to a network such as laptops, smartphones, tablets and sensors. MEC provides a distributed computing environment for application and service hosting. It also has the ability to store and process content in close proximity to cellular subscribers for faster response time. Edge computing covers a wide range of technologies such as wireless sensor networks, mobile data acquisition, mobile signature analysis, cooperative distributed peer-to-peer ad hoc networking and processing also classifiable as local cloud/fog computing and grid/mesh computing, dew computing, mobile edge computing, cloudlet, distributed data storage and retrieval, autonomic self-healing networks, remote cloud services, augmented and virtual reality, data caching, Internet of Things (massive connectivity and/or latency critical), critical communications (autonomous vehicles, traffic safety, real-time analytics, time-critical control, healthcare applications).

The communication system is also able to communicate with other networks, such as a public switched telephone network or the Internet as illustrated by the component referenced by reference numeral 22, or utilize services provided by them. The communication network may also be able to support the usage of cloud services, for example at least part of core network operations may be carried out as a cloud service (this is depicted in FIG. 1 by "cloud" 24). The communication system may also comprise a central control entity, or a like, providing facilities for networks of different operators to cooperate for example in spectrum sharing.

The technology of Edge cloud may be brought into a radio access network (RAN) by utilizing network function virtualization (NVF) and software defined networking (SDN). Using the technology of edge cloud may mean access node operations to be carried out, at least partly, in a server, host or node operationally coupled to a remote radio head or base station comprising radio parts. It is also possible that node operations will be distributed among a plurality of servers, nodes or hosts. Application of cloudRAN architecture enables RAN real time functions being carried out at the RAN side (in a distributed unit, DU 14) and non-real time functions being carried out in a centralized manner (in a centralized unit, CU 18).

It should also be understood that the distribution of labour between core network operations and base station operations may differ from that of the LTE or even be non-existent. Some other technology advancements probably to be used are Big Data and all-IP, which may change the way networks are being constructed and managed. 5G is being designed to support multiple hierarchies, where MEC servers can be placed between the core and the base station or nodeB (gNB). It should be appreciated that MEC can be applied in 4G networks as well.

5G may also utilize satellite communication to enhance or complement the coverage of 5G service, for example by providing backhauling. Possible use cases are providing service continuity for machine-to-machine (M2M) or Internet of Things (IoT) devices or for passengers on board of vehicles, or ensuring service availability for critical communications, and future railway/maritime/aeronautical communications. Satellite communication may utilize geostationary earth orbit (GEO) satellite systems, but also low earth orbit (LEO) satellite systems, in particular megaconstellations (systems in which hundreds of (nano)satellites are deployed). Each satellite 16 in the mega-constellation may cover several satellite-enabled network entities that create on-ground cells. The on-ground cells may be created via an on-ground relay node 14 or by a gNB located on-ground or in a satellite.

It is understandable for a person skilled in the art that the depicted system is only an example of a part of a radio access system and in practice, the system may comprise a plurality of (e/g)NodeBs, the device may have an access to a plurality of radio cells and the system may comprise also other apparatuses, such as physical layer relay nodes or other network elements, etc. One of the (e/g)NodeBs or may be a Home(e/g)nodeB. Additionally, in a geographical area of a radio communication system a plurality of different kinds of radio cells as well as a plurality of radio cells may be provided. Radio cells may be macro cells (or umbrella cells) which are large cells, usually having a diameter of up to tens of kilometers, or smaller cells such as micro-, femto- or picocells. The (e/g)NodeBs of FIG. 1 may provide any kind of these cells. A cellular radio system may be implemented as a multilayer network including several kinds of cells. Typically, in multilayer networks, one access node provides one kind of a cell or cells, and thus a plurality of (e/g) NodeBs are required to provide such a network structure.

For fulfilling the need for improving the deployment and performance of communication systems, the concept of "plug-and-play" (e/g)NodeBs has been introduced. Typically, a network which is able to use "plug-and-play" (e/g)Node Bs, includes, in addition to Home (e/g)NodeBs (H(e/g)nodeBs), a home node B gateway, or HNB-GW (not shown in FIG. 1). A HNB Gateway (HNB-GW), which is typically installed within an operator's network may aggregate traffic from a large number of HNBs back to a core network.

Figure 2A:
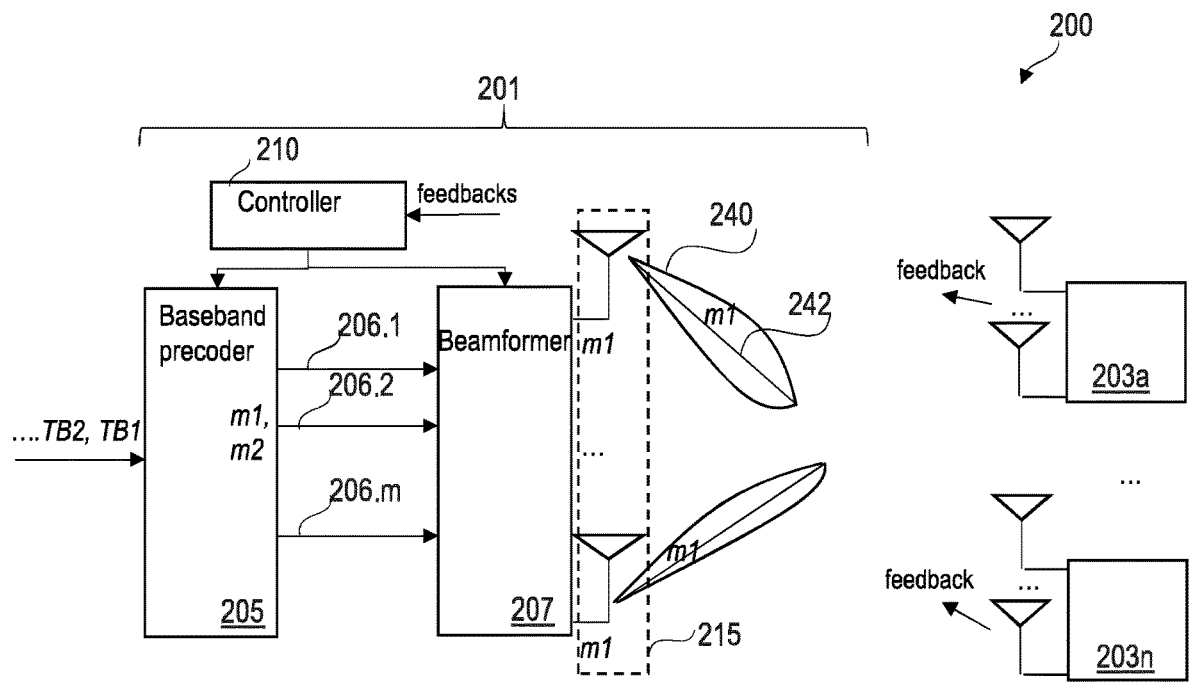
FIG. 2A is a schematic illustration of a communication system.

FIG. 2A is a diagram illustrating an exemplary wireless communication system 200 in accordance with an example of the present subject matter. For example, the communication system 200 may be configured so that communication of data between the multi-beam transmission system 201 and receiving devices 203a through 203n is performed according to a PTP transmission scheme and/or PTM transmission scheme.

The communication system 200 comprises a multi-beam transmission system 201. The multi-beam transmission system 201 may, for example, be a base station such as a gNB as described with reference to FIG. 1. The communication system 200 further comprises receiving devices 203a through 203n such as user equipments. The multi-beam transmission system 201 may serve the receiving devices 203a through 203n within a geographical coverage area of service or cell. However, as the number of receiving devices 203a through 203n in the cell grows, it may be advantageous to use beamforming for improving the signal to noise (SNR) performance and reduce multiuser interference of the communication system 200. This may enable to service a large number of receiving devices. For that, the multi-beam transmission system 201 may comprise a digital baseband precoder 205 followed by a beamformer 207. The precoder 205 may perform data processing in accordance with the radio interface protocol such as channel encoding and rate matching. At least one of low-density parity check (LDPC) code, Turbo code, convolution code, and polar code may be used for the channel encoding. The precoder 205 may generate from each transport block of a stream of transport blocks TB1, TB2 . . . a message m1, m2 . . . , respectively e.g. by performing constellation mapping. Each message of the messages may comprise a set of one or more modulation symbols. The sets of modulation symbols m1, m2 . . . may be output to a plurality of transmission paths 206.1 through 206.m. The sets of modulation symbols m1, m2 . . . may be output to the plurality of transmission paths 206.1 through 206.m depending on the communication scheme being used. For example, the same set of modulation symbols may be provided to the plurality of transmission paths 206.1 through 206.m. The plurality of transmission paths 206.1 through 206.m may, for example, convert digital signals into analog signals. For that, each of the plurality of transmission paths 206.1 to 206.m may include a RF chain. The RF chain may comprise a digital-to-analog (DAC) converter and a power amplifier. In one example, each transmission path may be associated with a respective independent antenna array of the multi-antenna system 215. In another example, the transmission paths may share the multi-antenna system 215.

The beamformer 207 drives a plurality of RF antennas of a multi-antenna system 215 with respectively phased transmit messages m1, m2, . . . to form corresponding beams 240 of RF output energy in accordance with the present subject matter. The beams 240 may be formed depending on the communication scheme being used. For example, each message of the messages m1, m2, . . . may be transmitted in each of the beams at a time. Each of the beams 240 may be directed in a beam direction 242. The beams 240 may be received at the respectively located receiving devices 203a through 203n by respective pluralities of receive antennas at each receiving device and optionally phase shifted and combined after receipt in order to provide corresponding beam pattern sensitivity to the received beams. The beamforming may be performed using beamforming settings associated with each beam direction. The beamforming settings may, for example, comprise weights of magnitudes and/or phases associated with the antenna elements of the multi-antenna system 215. The beamformer 207 may be configured to control the multi-antenna system 215 to steer the directional beam 240 in the beam direction 242 e.g. between 0 and 90 degrees. The beamformer 207 may control the multi-antenna system 215 to steer the directional beam 240 by configuring beamforming settings of the multi-antenna system 215. For example, the beamformer 207 may configure the beamforming settings of the multi-antenna system 215 by adjusting phase shifts to be applied to the antenna elements of the multi-antenna system 215. Adjusting the phase shifts may enable to determine and/or control a width, gain and/or direction of the directional beam 240. The transmission of the messages m1, m2, . . . in the beams 240 may be performed in accordance with a beam sweeping configuration scheme. For example, multiple beam sweeping configurations may be defined and used by the beamformer 207 so that the messages may be transmitted according to these beam sweeping configurations.

The receiving devices 203a-n may be configured to transmit feedback information to allow the multi-beam transmission system 201 to determine how to configure its analog beamforming selections and its baseband precoding configurations, respectively for improved performance. For example, the multi-beam transmission system 201 may comprise a controller 210. The controller 210 may receive the feedback information and may control the multi-beam transmission system 201 accordingly. For example, the feedback information may include channel state information. The channel state information may include at least one of a rank indicator (RI), a precoding matrix indicator (PMI), or a channel quality indicator (CQI). The CQI may, for example, indicate a modulation scheme and/or a code rate that can attain a desired target error rate (e.g., a frame error rate (FER), a block error rate (BLER), and a packet error rate (PER)) in the estimated channel quality. For example, the multi-beam transmission system 201 may index the beams 240. Each receiving device 203a-n may transmit back to the multi-beam transmission system 201 the feedback information further indicating which one or more of the indexed beams was most powerful and/or has highest SNR signals. The controller 210 may also be configured to control the baseband precoder 205 and the beamformer 207 in a way that the coverage is provided throughout the cell, without using explicit feedback from the receiving devices 203a-n.

Figure 2B:
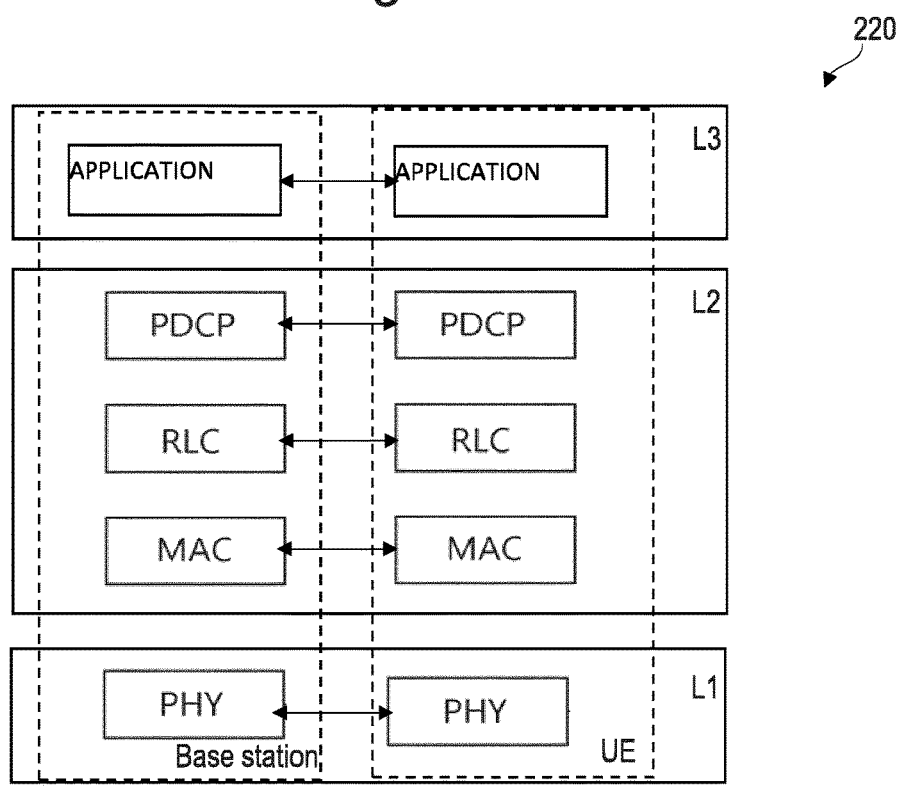
FIG. 2B is a schematic illustration of a radio interface protocol.

The communication of data as described above between the multi-beam transmission system 201 and each of the receiving devices 203a through 203n may be performed in accordance with a radio interface protocol 220 (e.g. a user plane protocol) as shown in FIG. 2B. Layers of the radio interface protocol 220 may be classified into a first layer (L1), a second layer (L2), and a third layer (L3) based on the lower three layers of the open system interconnection (OSI) model. The transport blocks are received in accordance with the second layer and the third layer of the protocol and the processing of the transport blocks as described above is performed according to the first layer of the protocol. A physical layer belongs to the first layer L1. The physical layer provides a higher layer with an information transfer service through physical channels. The physical layer provides its services to a medium access control (MAC) layer, which is a higher layer of the physical layer, via transport channels. The MAC layer belongs to the second layer L2. The MAC layer provides services to a radio link control (RLC) layer, which is a higher layer of the MAC layer, via logical channels. The MAC layer provides a function of mapping multiple logical channels to multiple transport channels. The MAC layer also provides a function of logical channel multiplexing by mapping multiple logical channels to a single transport channel. The RLC layer belongs to the second layer L2. The RLC layer may provide a function of adjusting a size of data, so as to be suitable for a lower layer to transmit the data, by concatenating and segmenting the data received from a higher layer in a radio section. A packet data convergence protocol (PDCP) layer belongs to the second layer L2. The PDCP layer provides a function of header compression function that reduces unnecessary control information such that data being transmitted by employing IP packets, such as IPv4 or IPv6, can be efficiently transmitted over a radio interface that has a relatively small bandwidth. A physical channel is mapped to the transport channel. Data is transferred between the MAC layer and the physical layer through the transport channel. Data may be transferred between a physical layer of a transmitter and a physical layer of a receiver, through the physical channel using radio resources. At the transmitting side, each layer receives a Service Data Unit (SDU) from a higher layer, for which the layer provides a service, and outputs a Protocol Data Unit (PDU) to the layer below. The RLC layer receives packets from the PDCP layer. These packets are called PDCP PDUs from a PDCP point of view and represent RLC SDUs from an RLC point of view. The RLC layer creates packets which are provided to the layer below, i.e. the MAC layer. The packets provided by RLC to the MAC layer are RLC PDUs from an RLC point of view, and MAC SDUs from a MAC point of view. At the receiving side, the process may be reversed, with each layer passing SDUs up to the layer above, where they are received as PDUs.

The data transmitted by the multi-beam transmission system 201 may be provided as described with reference to FIGS. 3A and 3B.

Figure 3A:
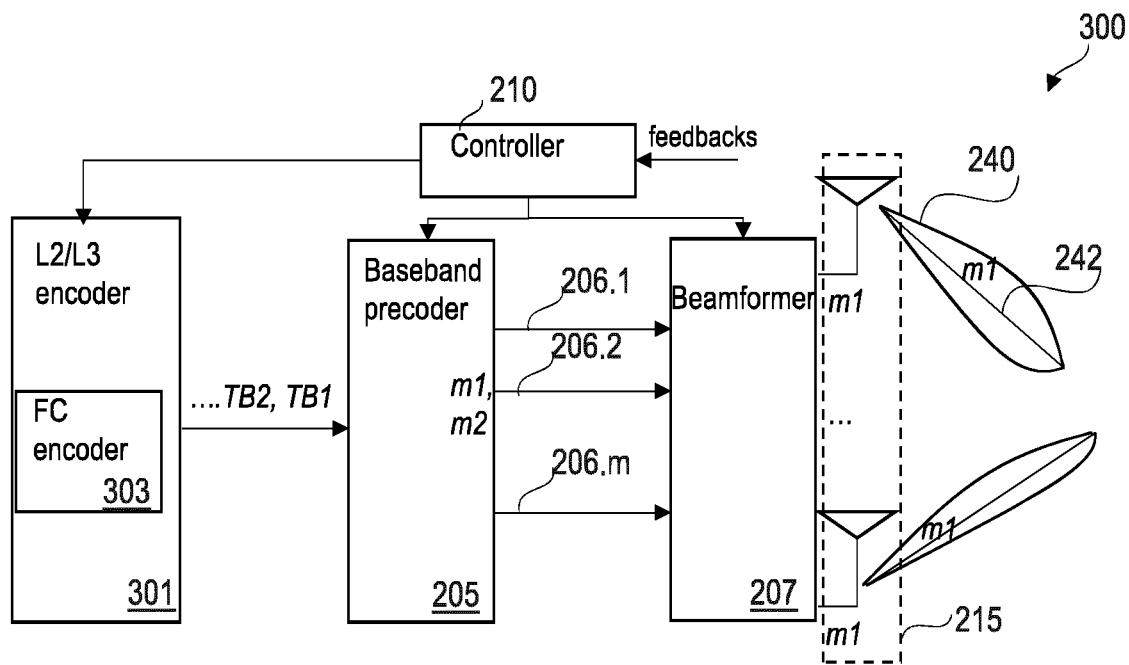
FIG. 3A is a schematic illustration of a multi-beam transmission system according to an example of the present subject matter.

FIG. 3A is a diagram illustrating an exemplary multi-beam transmission system 300 in accordance the present subject matter. The multi-beam transmission system 300 may be configured to operate in accordance with the radio interface protocol as described with reference to FIG. 2A, wherein one layer of the second and the third layers is adapted according to the present subject matter.

The multi-beam transmission system 300 comprises the multi-beam transmission system 200 and data encoder 301 referred to as L2/L3 encoder as it may operate according to the second and third layers of the radio interface protocol. The data encoder 301 comprises a fountain code (FC) encoder 303. The function of the FC encoder 303 may be implemented with a functional block inside any layer of the second and third layers. An expedient location for the implementation of the FC encoder 303 may be the RLC layer in order to minimize packet losses or counter measures against packet losses during intra-CU handover in the typical 5G CU/DU architecture. In another example, the FC encoder 303 may be implemented in the PDCP layer or at higher layers. Thus, the FC encoder 303 may be referred to as a packet-based FC encoder.

The FC encoder 303 may be configured to receive SDUs of a higher layer in a stream. The FC encoder 303 may be configured to transform each set of K SDUs of the stream into N PDUs, where N>K using the FC coding method. The FC coding method may be one of various packet-based Fountain codes, such as Raptor Codes, Random Linear Fountain Codes (RLFC) be it block (a.k.a. generation) based or using sliding window encoding, where for this to be efficient the constraint length of the code (e.g. the generation size in case of block-based RLFC) may have to be considerably larger than the number of beams/groups of beams sent at different times. For complexity reasons, it may be beneficial to only have a number of FC PDUs per transport block (e.g. the transport block may be a chunk of data transmitted at once (in one TTI or slot) and in one beam) as small as possible, because the likelihood of errors on different FC PDUs in the same transport block may be highly correlated across different FC PDUs. Hence, it may be expedient to have a number of parallel FC encoding processes that contribute approximately one FC PDU per transport block. The resulting transport blocks TB1, TB2 . . . may be provided as input to the precoder 205 in order to be processed as described with reference to FIG. 2A to generate the messages m1, m2 . . . . The set of K SDUs may be represented by a minimum number R of FC PDUs. The minimum number R of FC PDUs may, for example, be equal to or higher than the number K of SDUs, R>K, e.g. R=K, or R=K+1 depending on the coding method used. The set of K SDUs may, for example, be represented by any combination of R FC PDUs of the N FC PDUs. That is, a combination of one or more of the resulting messages m1, m2 . . . may represent the same set of K SDUs. This is by contrast to another scheme where a single combination of the messages m1, m2 . . . contains the set of K SDUs. Due to packet loss at the receiving devices, the another scheme may send each message of said single combination of messages multiple times from each beam/group of beams. This may be referred to as a blind retransmission hoping that each receiving device may receive a copy of the set of K SDUs.

Considering a delivery of user data, i.e.—compared to the system information carried by the BCH—large chunks of data or continuous streams may need to be transmitted. The FC PDUs may be transmitted in accordance with the beam sweeping mechanism. That is, different beams/groups of beams may not send exact copies of the same set of K SDUs, but different FC PDUs representing said set of K SDUs. This may be particularly advantageous because the probability of successfully decoding K SDUs that have been jointly encoded into N>K PDUs may be very close to 1 if any subset of at least K out of the N PDUs have been received. In this way, (N−K) redundant packets may fix almost certainly (N−K) packet losses, irrespective of which packets were lost or even when in the conventional scheme where both the initial and the retransmission are lost. Therefore, the redundancy required to achieve a certain reliability level for the data delivery may be considerably lower compared to a blind retransmission scheme without FC.

The ratio between the number N of FC PDUs and the number K of FC SDUs may depend on the beam sweeping configuration, e.g. it may scale linearly with the number of different PTM transmissions that are required to cover the whole cell with the PTM service. For example, the rate K/N of the Fountain encoder may be selected as $(1-\Delta error)/Nbeams$, where Nbeams, and $\Delta error$ denote the number of sets of beams over which sweeping is done and a margin to deal with packet losses even on the strongest beam of the UE, respectively. For example, if the sweeping is performed as described above according to r beam sweeping configurations then Nbeams is equal to r. That is, if a UE manages to decode at the physical layer only packets from a single beam and thereby has a packet loss rate not exceeding terror within a group of FC PDUs representing a group of FC SDUs, then it can almost certainly decode the corresponding FC SDUs. In another example, and in the presence of a feedback channel, the rate K/N may be adapted dynamically to the actual needs of the receiving UEs. That is, UEs periodically report their FC PDU reception rates Nrec/K, where Nrec denotes the number of FC PDUs received per K FC SDUs along with information over which beams these were received e.g. as long as Nrec/K≥1, the UE can normally decode. The base station may then adapt (e.g. if Nrec/K<1) the number of FC PDUs sent on each beam accordingly—possibly with a margin—to ensure that each UE will receive sufficient (at least K) PDUs in order to decode all FC SDUs.

Figure 3B:
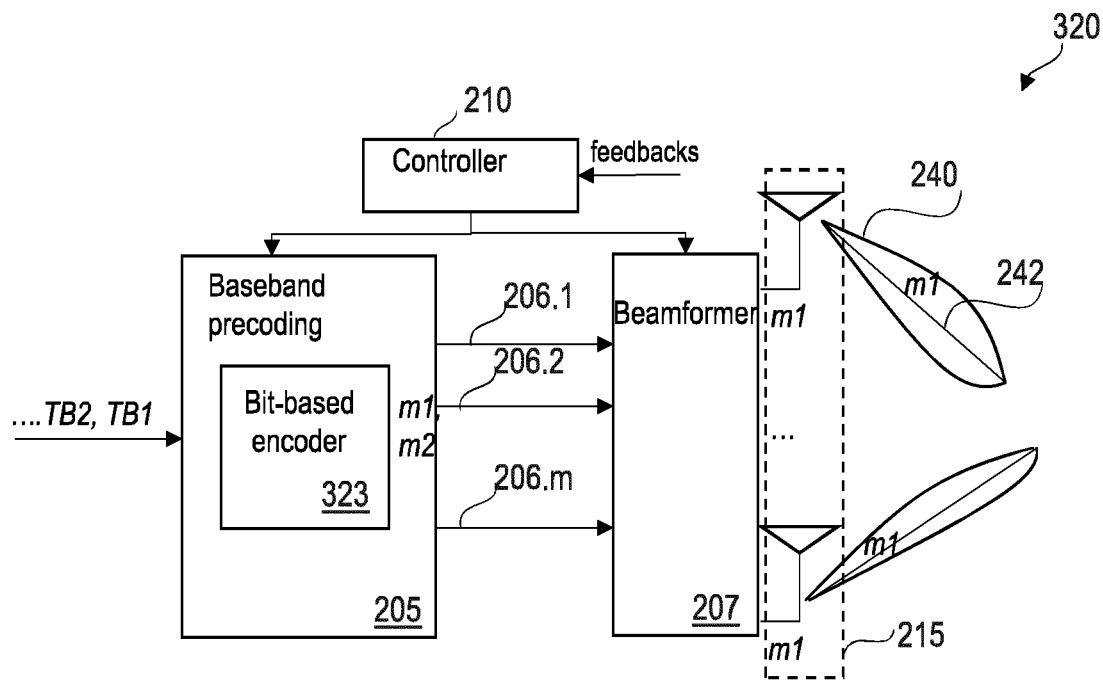
FIG. 3B is a schematic illustration of a multi-beam transmission system according to an example of the present subject matter.

FIG. 3B is a diagram illustrating an exemplary multi-beam transmission system 320 in accordance with an example of the present subject matter. The multi-beam transmission system 320 may be configured to operate in accordance with the radio interface protocol as described with reference to FIG. 2A, wherein physical layer is adapted according to the present subject matter.

The multi-beam transmission system 320 comprises the multi-beam transmission system 200, wherein the baseband precoder comprises a bit-based encoder 323. The bit-based encoder 323 may operate on bit level. The bit-based encoder 323 may be configured to receive a stream of transport blocks and process each transport block of the transport blocks using the bit-based data processing method described herein. This may result, for each transport block, in one message having multiple redundancy versions. Each of the redundancy versions may be encapsulated in a respective message and the messages may be transmitted as described above. This may have the advantage that the receiving device can perform soft combining across different redundancy versions received for the same packet on the different beams, which leads to a gain in effective SINR of the physical layer FEC decoder. This approach may require that each individual message is decoded successfully when being the only received message.

Figure 4:
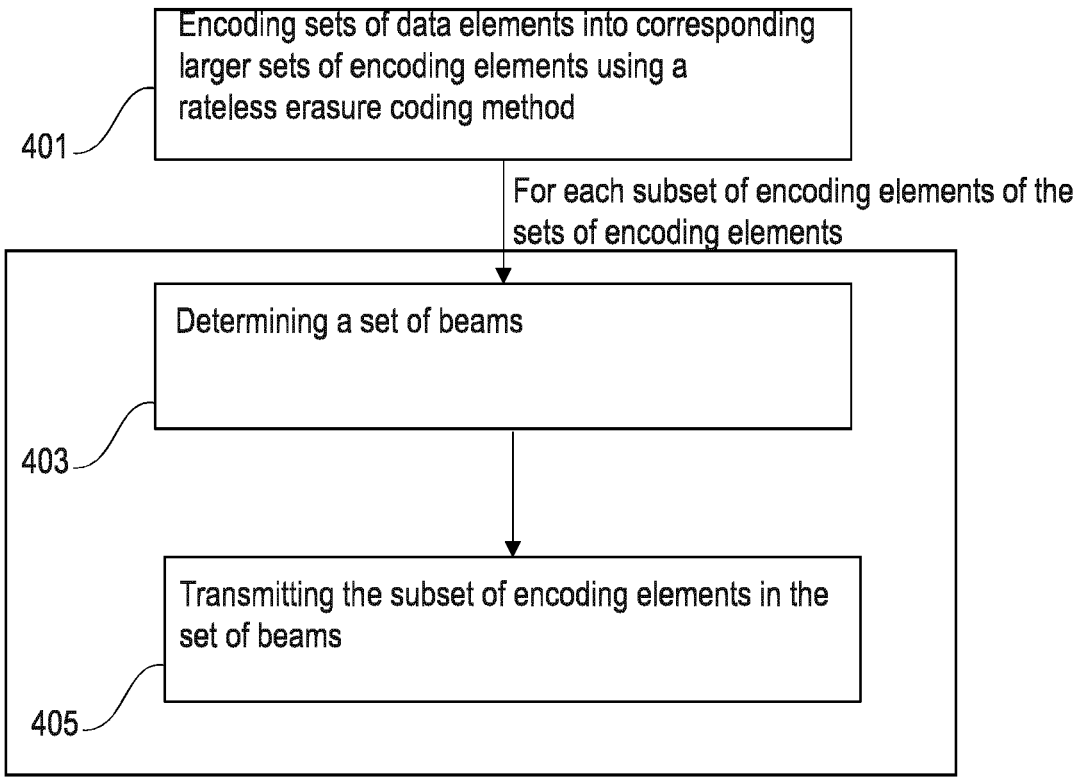
FIG. 4 is a flowchart of a method used in a base station according to an example of the present subject matter.

FIG. 4 is a flowchart of a method used in a base station according to an example of the present subject matter. For the purpose of explanation, the method may be implemented in the system illustrated in previous FIGS. 2-3, but is not limited to this implementation.

Multiple sets of data elements SET1, SET2 . . . SETn may be encoded in step 401 (e.g. by the FC encoder 303) into corresponding larger sets of encoding elements FC1, FC2 . . . FCn using a rateless erasure coding method. The rateless erasure coding method may, for example, use Fountain coding to generate the encoding elements. The set of encoding elements FC1 may be generated from the set of data element SET1, the set of encoding elements FC2 may be generated from the set of data element SET2, and so on. The set of data elements SET1 may comprise K1 data elements. The set of data elements SET2 may comprise K2 data elements and so on. The numbers of elements K1, K2 . . . Kn may be the same or different numbers. The set of encoding data elements FC1 may comprise N1 encoding data elements, where N1>K1. The set of encoding data elements FC2 may comprise N2 encoding data elements, where N2>K2 and so on. The numbers of elements N1, N2 . . . Nn may be the same or different numbers.

The sets of data elements SET1, SET2 . . . SETn may be received as part of chunks of data or as a continuous stream of data. In one encoding example, each data element of the sets of data elements may be an SDU. In this case, each encoding data element of the sets of encoding elements FC1, FC2 . . . FCn may be provided as a PDU (FC PDU).

Figure 5:
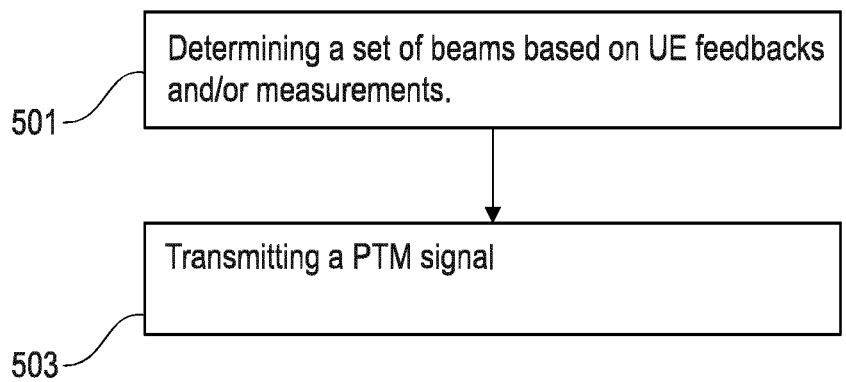
FIG. 5 is a flowchart of a method used in a base station according to an example of the present subject matter.

According to the encoding example, for each set of data elements of the sets of data elements SET1, SET2 . . . SETn, multiple transport blocks may be formed and provided to the physical layer. This may result in a stream of transport blocks to be transmitted. For example, multiple transport blocks where i varies between 1 and x≥2, may be formed for the set of data elements SET1, multiple transport blocks $TB_i^2$ may be formed for the set of data elements SET2 and so on. Each transport block of the transport blocks $TB_i^1$ comprises a distinct subset of encoding elements of the set of encoding elements FC1. Each transport block of the transport blocks $TB_i^2$ comprises a distinct subset of encoding elements of the set of encoding elements FC2 and so on. In case of the encoding example, transport blocks may be generated from the FC PDUs. For example, each transport block may comprise one FC PDU. The transmission of the sets of encoding elements FC1, FC2 . . . FCn comprises transmitting each transport block of the transport blocks in each beam of a set of beams at a time. For that, a set of beams of the multi-antenna system 215 may be determined in step 403 for each transport block of the transport blocks and the transport block may be transmitted in said set of beams in step 405. For example, the beamformer 207 may control the multi-antenna system 215 to form the set of beams in order to transmit the transport block in the set of beams. The set of beams determined for one transport block may or may not be the same set of beams determined for another transport block. FIG. 5 provides further details of step 403.

Hence, the transmission may be performed in accordance with a redundancy, wherein the level of redundancy may advantageously be low in accordance with the present subject matter. This is because, each set of elements e.g. SET1 may be represented by different combinations of K1 elements of the corresponding N1 encoding data element FC1. For example, if SET1 has 10 elements and FC1 has 15 elements, any subset of 10 encoding elements of the 15 elements may be used to reconstruct the 10 elements of SET1 at the receiving device.

The transmission of each transport block of the transport blocks may further be enhanced using the bit-based data processing method. For example, each transport block of the transport blocks may be processed using the bit-based data processing method in order to transmit multiple redundancy versions of the transport block. That is, step 405 may be repeated for each transport block a number of times equal to the number of redundancy versions, wherein in each repetition a different set of beams is used.

FIG. 5 is a flowchart of a dynamic beam management method used in a base station according to an example of the present subject matter. For the purpose of explanation, the method may be implemented in the system illustrated in previous FIGS. 2-3, but is not limited to this implementation.

Based on either measurements made in the downlink in combination with reporting from the UEs to the multi-beam transmission system 201 or based directly on measurements made in the uplink, the multi-beam transmission system 201 may determine in step 501, in which directions and in which beams the multi-beam transmission system 201 may emit in step 503 the PTM signal. In one example, the measurement/reporting on the beams used for the PTP scheme may be used to transmit the PTM signal in a set of beams that is derived from the measurements/reports from different UEs interested in the PTM service. In this case, no PTM-beam specific measurements may have to be defined. Alternatively, the multi-beam transmission system 201 may assign unique beam IDs to the effective beams 240, such that UEs may also measure and report on those individual beams. This alternative may be advantageous in situations where the combination of multiple PTP beams into a PTM beam may provide considerably better channel quality than any of the individual PTP beams.

The advantage of the dynamic beam management as a whole may be that the multi-beam transmission system 201 may concentrate its transmit signal power into directions where UEs are actually interested in the PTM service and with that also avoid unnecessary interference to neighbouring cells. Accordingly, the primary objective of this method may be the selection of a set of beams to use to provide the PTM service to the UEs.

On a second level of dynamic beam management, the multi-beam transmission system 201 may—again based on the above measurements/reports—decide on how to serve the UEs with the PTM service. E.g. when there is a relatively large number of UEs for which a certain beam would be suitable, a PTM transmission might be more suitable, while single UEs in a certain direction may better be served using PTP type transmissions. Any decisions made in this context may be updated dynamically, e.g. based on UEs distribution or interest.

Figure 6:
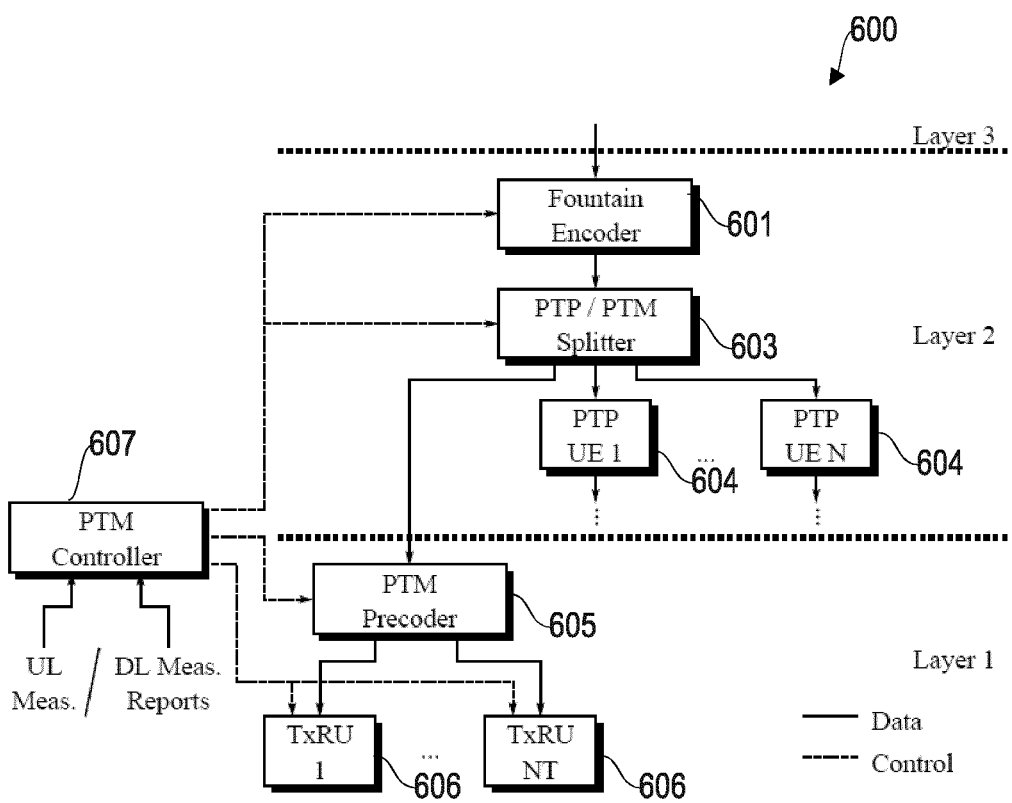
FIG. 6 is a schematic illustration of a base station according to an example of the present subject matter.

FIG. 6 is a diagram illustrating an exemplary base station 600 in accordance with an example of the present subject matter. FIG. 6 does not provide a complete illustration of the base station's protocol stack, but it is limited to the parts that may be of interest in the present context.

User data arriving from higher layers is fed into a Fountain encoder 601. The Fountain encoder 601 may be located in the RLC layer and may aggregate (concatenate and segment) RLC SDUs to form equally sized packets for optimal efficiency of the packet-based Fountain Code. Typically—and advantageously for the beam sweeping—the Fountain encoder 601 may generate more code packets (PDUs) than it received as input packets (SDUs). Like several subsequent blocks, the Fountain encoder 601 may be managed by a PTM controller 607, which may be provided as part of the radio resource management functionality. The PTM controller 607 may make its decisions based on measurements taken in the uplink exploiting the reciprocity of the radio channel between uplink and downlink that is for large-scale parameters valid not only for TDD but also for FDD. This approach may be suitable for operation at lower carrier frequencies and without strong analogue beamforming. At higher frequencies in the mm-wave regime, strong analogue beamforming in combination with a relatively small number of TxRUs may often be used. In this case, a mechanism, where the UEs perform measurements on beams sent in the downlink and send corresponding measurement reports or beam selections to the base station 600 may be more practical. The PTM controller 607 may also rely on feedback reports from the UEs on packet reception rates to fine-tune the rate of the Fountain Code.

The next block in the path of the data packets is a PTP/PTM splitter 603, which guides copies of the data packets towards appropriate transmission buffers, depending on the PTM controller decision to serve all or some UEs in PTM mode and/or some UEs in PTP mode. In the latter case, the usual PTP procedures (e.g. HARQ) may be used such that redundant packets added by the FC encoder 601 can be largely filtered out prior to transmission. However, for the purpose of fast lossless PTP/PTM switching at any point in time, it may be desirable to leave at least some redundant packets even in the PTP stream. A scheduler (not shown) may make resource allocation decisions, which may involve spatial multiplexing of PTP and PTM transmissions on the same physical resources, which in 5G are blocks in time and frequency. This may depend on the set of beams and TxRUs that are occupied by the PTM transmissions. Based on the scheduler's and the PTM Controller's decisions, a PTM precoder 605 may map the PTM layer-1 encoded and QPSK/QAM modulated data onto the TxRUs that are to transmit the data together. Finally, the selected set of TxRUs may emit the signal as provided by the PTM precoder 605, where the PTM controller 607 may set the TxRUs analogue beam if the TxRU supports this, which is typically the case in mm-wave systems.

The procedures detailed above may be advantageous for a static operation to provide full coverage for a PTM service throughout the entire cell. In another example, and for reasons of resource utilization efficiency, it may be desirable to focus the PTM service only to areas where UEs are actually interested in the service. In one implementation, UEs measure different beams of the Grid-of-Beams (GoB) as provided by the base station 600 for PTP services and report on a preferred beam to receive the PTM service. This may be a report on the strongest beam. The base station 600 collects all the information about preferred beams and transmits the same PTM signal jointly in all beam directions for which at least Nmin mobile stations reported on this being the strongest beam. If the number of beam directions exceed the number that can be simultaneously handled by the antenna array, then different groups of beams that lie as close as possible to each other may be formed and served in time multiplex, as also mentioned above.

In another implementation, UEs measure different beams of the GoB as provided by the base station 600 for PTP services and report on a preferred beam to receive the PTM service. This may be a report on one or several beams, for which the received signal strength lies above a certain threshold. From this, the base station 600 derives a minimal set of beam directions such that for each UE, at least one of the reported preferred beam directions is included. If for any beam direction the number of UEs lies below a threshold Nmin, the beam may be dropped and the corresponding UEs may be served in PTP mode. As described above, the same PTM signal is transmitted in all remaining beam directions and sweeping in conjunction with Fountain Coding as described above may be applied if the number of beam directions is too large.

In another implementation, in particular when multiple TxRUs work together to form a narrower (digital) beam, specific antenna ports may be used for the different instances of the PTM beam sweep such that UEs can differentiate between them and report on preferred PTM beams. This reporting may be either a report on the best beam or on all beams that lie above a certain threshold such that either of the two schemes for dynamic PTM selection and dropping of mobile stations to PTP channels described above may be applied. As described above, the same PTM signal may be transmitted in all remaining beam directions and sweeping may be applied if the number of beam directions is too large.

In another implementation, the base station 600 takes measurements based on reference signals sent by the UE in the uplink to determine the ideal directions to deliver the PTM service to the UEs. The base station 600 may collect all the thus obtained directions and eliminate directions such that no pair is closer than ~W3 dB of the elementary beam decided for PTM service as described above in both azimuth and elevation. Furthermore, beam directions for which the number of UEs covered by this beam is smaller than Nmin may also be dropped and the corresponding UEs served via PTP channels. The remaining set of beams may again be fed with the identical signal to form an effective wide beam. If the number of beam directions exceeds the number that can be simultaneously handled by the base station array, then different groups of beams that lie as close as possible to each other may be formed and served in time multiplex in conjunction with Fountain Coding, as also mentioned above.

Figure 7:
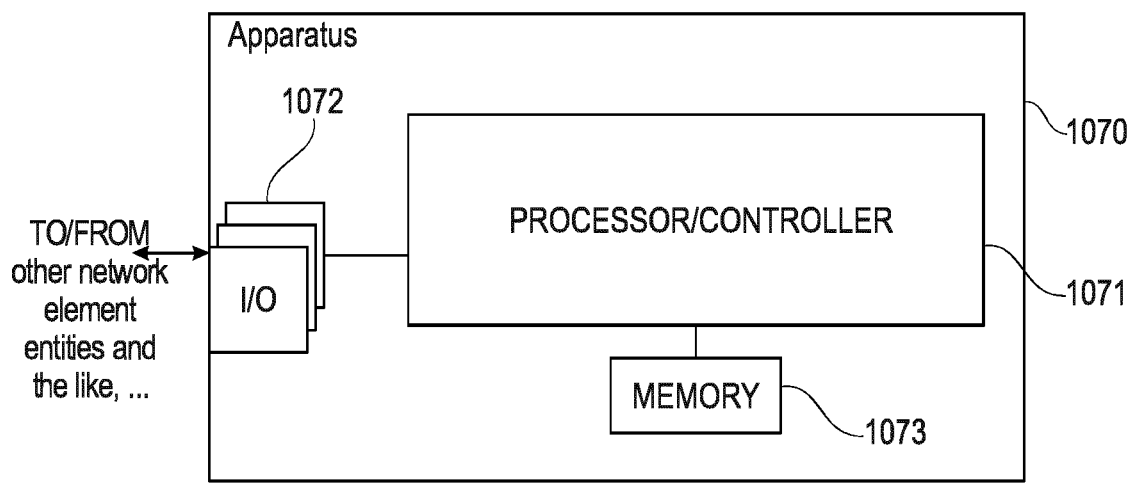
FIG. 7 is a block diagram showing an example of an apparatus according to an example of the present subject matter.

In FIG. 7, a block circuit diagram illustrating a configuration of an apparatus 1070 is shown, which is configured to implement at least part of the present subject matter. It is to be noted that the apparatus 1070 shown in FIG. 7 may comprise several further elements or functions besides those described herein below, which are omitted herein for the sake of simplicity as they are not essential for the understanding. Furthermore, the apparatus may be also another device having a similar function, such as a chipset, a chip, a module etc., which can also be part of an apparatus or attached as a separate element to the apparatus 1070, or the like. The apparatus 1070 may comprise a processing function or processor 1071, such as a central processing unit (CPU) or the like, which executes instructions given by programs or the like related to a flow control mechanism. The processor 1071 may comprise one or more processing portions dedicated to specific processing as described below, or the processing may be run in a single processor. Portions for executing such specific processing may be also provided as discrete elements or within one or more further processors or processing portions, such as in one physical processor like a CPU or in several physical entities, for example. Reference sign 1072 denotes transceiver or input/output (I/O) units (interfaces) connected to the processor 1071. The I/O units 1072 may be used for communicating with one or more other network elements, entities, terminals or the like. The I/O units 1072 may be a combined unit comprising communication equipment towards several network elements or may comprise a distributed structure with a plurality of different interfaces for different network elements. Reference sign 1073 denotes a memory usable, for example, for storing data and programs to be executed by the processor 1071 and/or as a working storage of the processor 1071.

The processor 1071 is configured to execute processing related to the above described subject matter. In particular, the apparatus 1070 may be configured to perform at least part of the method as described in connection with FIG. 4, or 5.

For example, the processor 1071 is configured to: encode sets of data elements into corresponding larger sets of encoding elements using a rateless erasure coding method, for each subset of one or more encoding elements of the sets of encoding elements determining a set of one or more beams of a multi-antenna system, and transmitting the subset of one or more encoding elements in the set of beams simultaneously.

As will be appreciated by one skilled in the art, aspects of the present invention may be embodied as an apparatus, method, computer program or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon. A computer program comprises the computer executable code or "program instructions".

Any combination of one or more computer readable medium(s) may be utilized. The computer readable medium may be a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

Generally, the program instructions can be executed on one processor or on several processors. In the case of multiple processors, they can be distributed over several different entities. Each processor could execute a portion of the instructions intended for that entity. Thus, when referring to a system or process involving multiple entities, the computer program or program instructions are understood to be adapted to be executed by a processor associated or related to the respective entity.

The invention claimed is:

1. An apparatus comprising:
   at least one processor; and
   at least one memory storing instructions that, when executed with the at least one processor, cause the apparatus to perform:
   encoding sets of data elements into corresponding larger sets of encoding elements using a rateless erasure coding method;
   for each subset of one or more encoding elements of the sets of encoding elements:
   determining a set of one or more beams of a multi-antenna system; and
   transmitting the subset of the one or more encoding elements in the set of one or more beams simultaneously, wherein the determining the set of one or more beams is performed such that transmission of the subset of encoding elements is performed in accordance with a point to multipoint transmission.

2. The apparatus of claim 1, where the instructions, when executed with the at least one processor, cause the apparatus to determine the set of one or more beams such that the transmission of the subset of encoding elements is performed in accordance with the point to multipoint transmission and a point to point transmission.

3. The apparatus of claim 1, where the instructions, when executed with the at least one processor, cause the apparatus to determine the set of one or more beams in accordance with a different beam-sweeping configuration of multiple predefined beam-sweeping configurations with adapting beamforming settings of the multi-antenna system to said beam-sweeping configuration.

4. The apparatus of claim 1, where the instructions, when executed with the at least one processor, cause the apparatus to transmit data in accordance with a radio interface protocol, wherein the set of data elements is a set of service data units of a layer of the radio interface protocol, wherein the set of encoding elements are provided as a set of protocol data units of the layer-respectively.

5. The apparatus of claim 4, where the instructions, when executed with the at least one processor, cause the apparatus to:
   for each set of data elements:
   forming multiple transport blocks, each transport block of the transport blocks comprising a distinct subset of the subsets of encoding elements of the set of encoding elements corresponding to said set of data elements.

6. The apparatus of claim 1, wherein a number of encoding elements in each subset of the subsets is smaller than a predefined maximum number of encoding elements.

7. The apparatus of claim 1, the rateless erasure coding method having code rate K/N, where K is a number of data elements in a set of data elements and N is a number of encoding elements in a corresponding set of encoding elements, wherein the code rate is a fixed code rate or a dynamically determined code rate.

8. The apparatus of claim 7, wherein the encoding elements are transmitted using sets of beams, the code rate is equal to $(1-\Delta_{error})/N_{beams}$, where $N_{beams}$ is the number of the sets of one or more beams, and $\Delta_{error}$ is a predefined margin value.

9. The apparatus of claim 7, the where the instructions, when executed with the at least one processor, cause the apparatus to receive a feedback report from one or more user equipments, the feedback report being indicative of a reception rate $N_{rec}/K$ of received ones of the set of encoding elements, where $N_{rec}$ is a number of received encoding elements of the set of encoding elements, and dynamically determine the code rate based on the reception rate.

10. The apparatus of claim 1, the rateless erasure coding method being a Fountain coding method, the Fountain coding method being any one of Raptor coding method, Reed Solomon coding method and Random Linear Fountain Code method.

11. The apparatus of claim 1, where the instructions, when executed with the at least one processor, cause the apparatus to receive a feedback report from one or more user equipments; and perform measurements of downlink measurements, uplink measurements, or both downlink measurements and uplink measurements and use the feedback report, the measurements, or both feedback report and the measurements in order to determine the set of one or more beams.

12. The apparatus of claim 1, the multi-antenna system comprising multiple arrays of antenna elements, where the instructions, when executed with the at least one processor, cause the apparatus to perform a beamforming for determining one beam per array of antenna elements of the multiple arrays of antenna elements, resulting in the set of one or more beams.

13. A method used in a base station, the method comprising:
    encoding sets of data elements into corresponding larger sets of encoding elements using a rateless erasure coding method;
    for each subset of one or more encoding elements of the sets of encoding elements:
    determining a set of one or more beams of a multi-antenna system; and
    transmitting the subset of one or more encoding elements in the set of one or more beams simultaneously, wherein the determining the set of one or more beams is performed such that transmission of the subset of encoding elements is performed in accordance with a point to multipoint transmission.

14. A non-transitory computer readable medium comprising program instructions that, when executed by a base station, cause the base station to perform the method as claimed in claim 13.

15. An apparatus comprising:
    at least one processor; and
    at least one memory storing instructions that, when executed with the at least one processor, cause the apparatus to perform:
    coding a code block to generate a coded block of coded bits for transmission to multiple receivers;
    determining multiple subsets of bits of the coded block representing different redundancy versions of the coded block;
    for each subset of bits of the subsets of bits:
    determining a distinct set of one or more beams of a multi-antenna system; and
    transmitting the subset of bits in the set of one or more beams simultaneously, wherein the determining the distinct set of one or more beams is performed such that the transmission of the subset of bits is performed in accordance with a point to multipoint transmission.

16. A method used in a base station, the method comprising:
    coding a code block to generate a coded block of coded bits for transmission from a transmitter to multiple receivers;
    determining multiple subsets of bits of the coded block representing different redundancy versions of the coded block;

for each subset of bits of the subsets of bits:
- determining a distinct set of one or more beams of a multi-antenna system; and
- transmitting the subset of bits in the set of one or more beams simultaneously, wherein the determining the distinct set of one or more beams is performed such that the transmission of the subset of bits is performed in accordance with a point to multipoint transmission.

17. A non-transitory computer readable medium comprising program instructions that, when executed by a base station, cause the base station to perform the method as claimed in claim 16.

* * * * *